(12) United States Patent
Tang et al.

(10) Patent No.: US 6,172,915 B1
(45) Date of Patent: Jan. 9, 2001

(54) UNIFIED ERASE METHOD IN FLASH EEPROM

(75) Inventors: Yuan Tang; James C. Yu; Jeffrey W. Anthony, all of San Jose, CA (US)

(73) Assignee: EON Silicon Devices, Inc., Santa Clara, CA (US)

( * ) Notice: Under 35 U.S.C. 154(b), the term of this patent shall be extended for 0 days.

(21) Appl. No.: 09/408,705

(22) Filed: Sep. 30, 1999

(51) Int. Cl.⁷ .................................................. G11C 16/04
(52) U.S. Cl. .................................. 365/185.29; 365/185.22
(58) Field of Search ........................ 365/185.29, 185.18, 365/185.19, 185.11, 185.22, 218

(56) References Cited

U.S. PATENT DOCUMENTS

| | | | |
|---|---|---|---|
| 5,898,618 | * 4/1999 | Lakkapragada et al. | 365/185.29 |
| 5,982,670 | * 11/1999 | Yamashita | 365/185.29 |
| 5,991,206 | * 11/1999 | Shin | 365/185.29 |
| 5,995,417 | * 11/1999 | Chen et al. | 365/185.29 |
| 6,028,794 | * 2/2000 | Nakai et al. | 365/185.29 |

* cited by examiner

Primary Examiner—Son T. Dinh
(74) Attorney, Agent, or Firm—Davis Chin

(57) ABSTRACT

A unified erase method used in an array of flash EEPROM memory cells arranged in a plurality of sectors for performing either a single-sector, multiple-sector, or all-sector erasing operation with a reduced amount of total erase time and a uniform $V_T$ distribution as good as that of a single-sector erase operation is provided. An erase-verify operation is performed sequentially on the plurality of sectors from a first sector to a last sector beginning with a first address of each sector if its corresponding erase-on signal is not turned OFF. The current address of each sector is stored at a point where the erase-verify operation failed. An erase pulse is applied only to all sectors simultaneously that have not passed the erase-verify operation. The erase-verify operation is then repeated beginning at the current address stored. The erasing operation is terminated when the erase-on signal has been turned OFF in all sectors in the plurality of sectors.

12 Claims, 5 Drawing Sheets

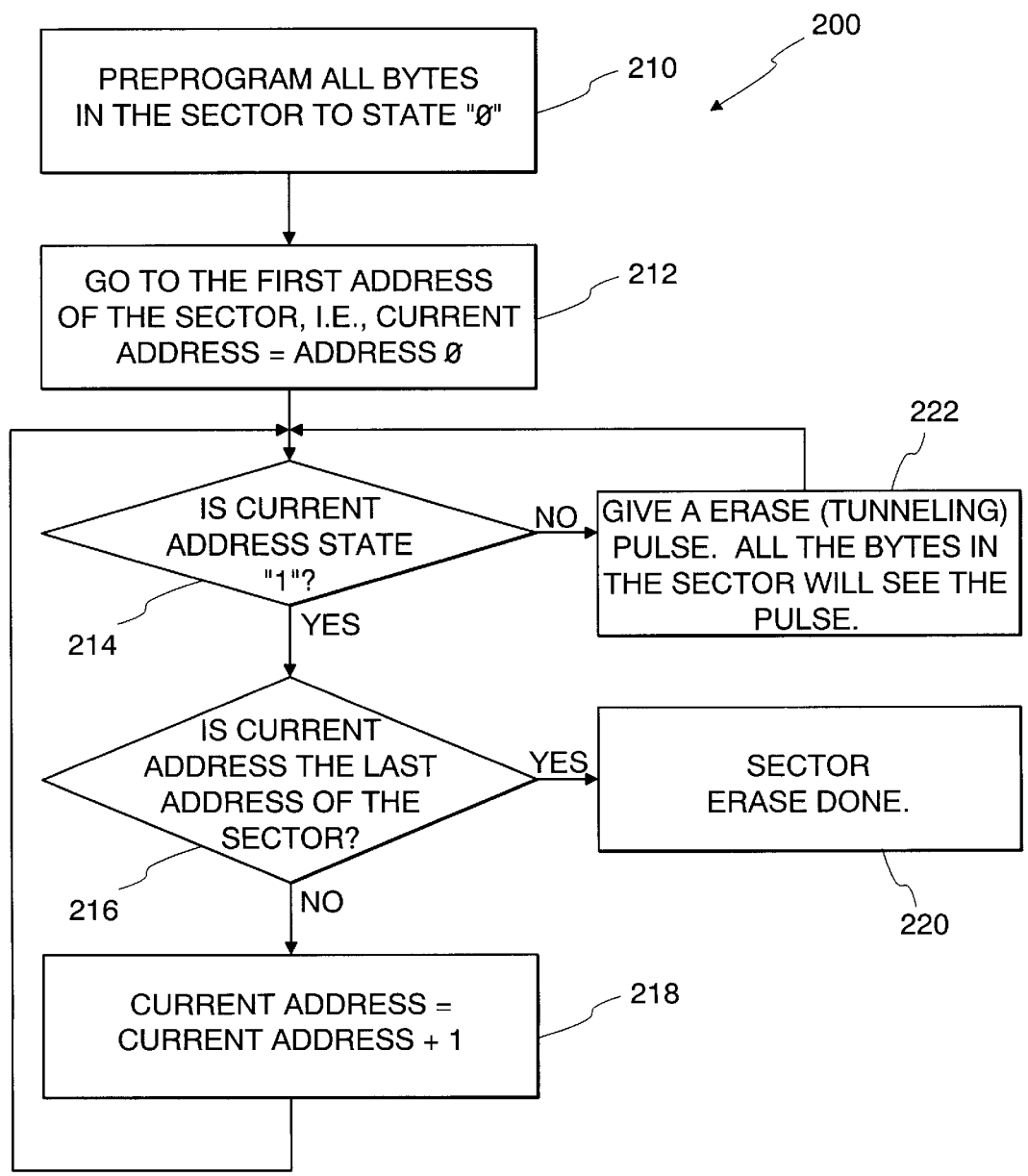
*Fig. 2 - Prior Art*

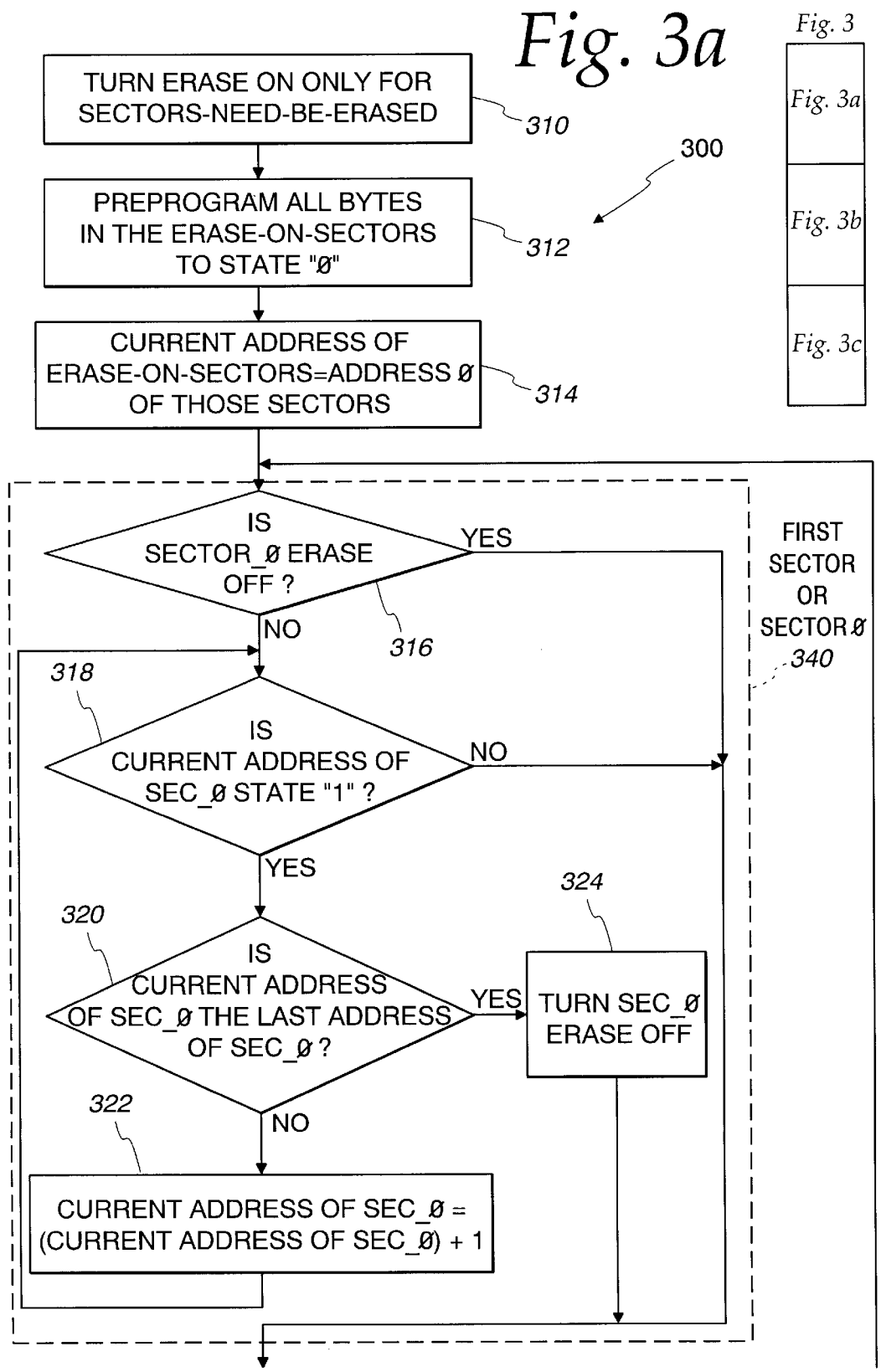

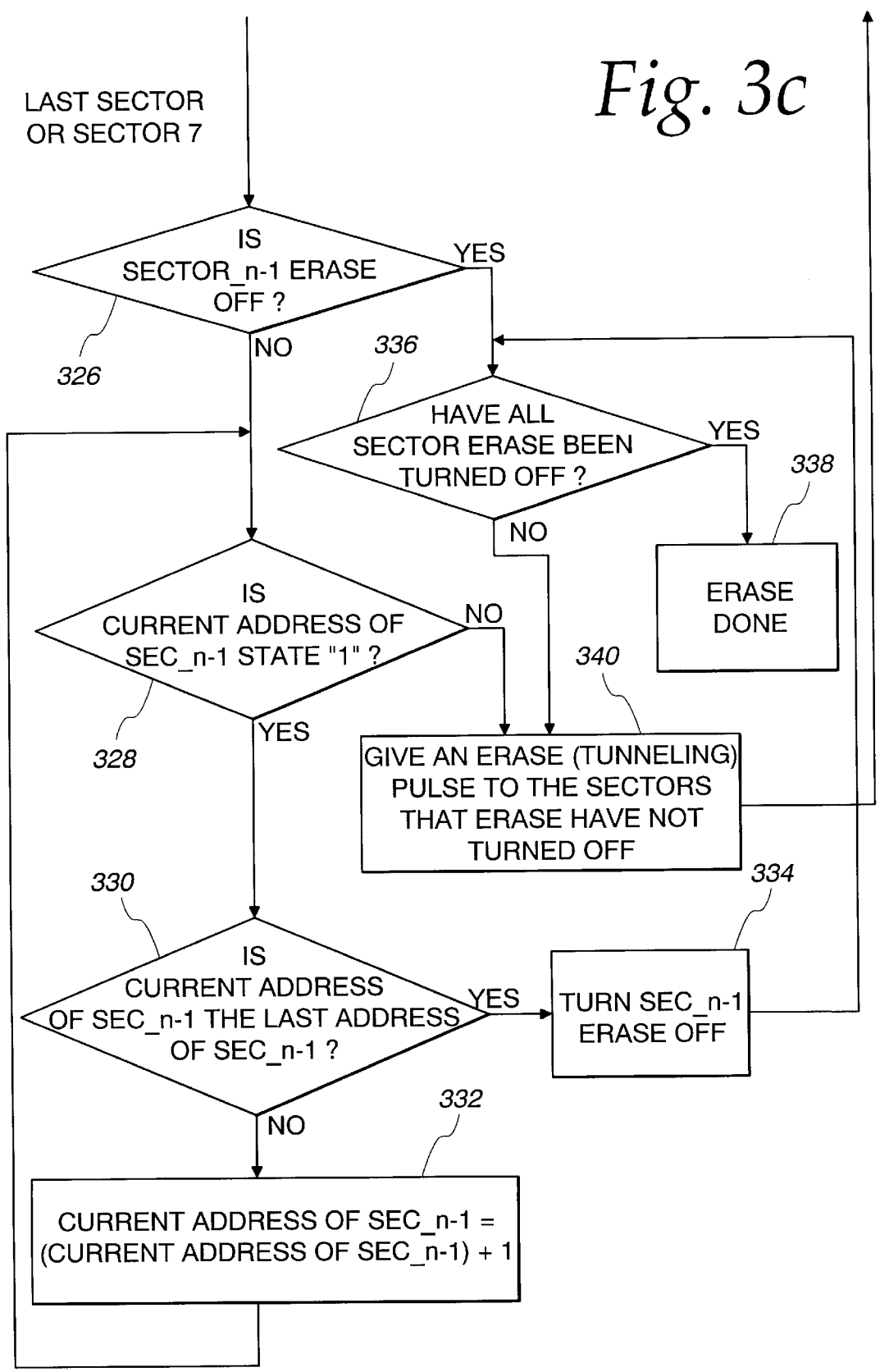

UNIFIED ERASE METHOD IN FLASH EEPROM

BACKGROUND OF THE INVENTION

This invention relates generally to floating gate memory devices such as an array of flash electrically, erasable programmable read-only memory (EEPROM) cells. More particularly, the present invention relates to a unified erase method used in an array of flash EEPROM memory cells arranged in a plurality of sectors for performing either a single-sector, multiple-sector, or all-sector (entire array) erasing operation with a reduced amount of total erase time.

As is generally well-known in the art, there have been provided electrical programmable and erasable memory array devices using a floating gate for the storage of charges thereon. In a conventional EEPROM memory device, a plurality of one-transistor core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

A particular type of EEPROM referred to sometimes as a "flash EPROM or EEPROM" divides the memory cells into a plurality of sectors. Within each sector, the source region of each cell transistor is tied to a common node. Therefore, all of the cells within the sector are erased simultaneously and erasure is performed only on a sector-by-sector basis. The control gates of the cell transistors are coupled to wordlines, and the drains thereof are coupled to bitlines.

Such EEPROMs are programmed in a conventional operation via hot-electron injection to the floating gate by application of high voltages to the control gate and the drain region which are above the potential applied to the source region. For example, the drain voltage applied is approximately +5.5 volts and the control gate voltage is approximately +12 volts. The source region is held at a ground potential. For the erasing operation by way of Fowler-Norheim tunneling, a positive voltage (e.g., +5 volts) is applied to the source region. A negative voltage (e.g., −8 volts) is applied to the control gate, and the drain region is allowed to float. In a read operation, the source region is held at a ground potential (0 volts) and the control gate has applied thereto a voltage of about +5 volts. The drain region is held at a voltage between +1 to +2 volts. Under these conditions, an unprogrammed or erased cell (storing a logic "1") will conduct a predetermined amount of current. On the other hand, the programmed cell (storing a logic "0") will not be rendered conductive. It should be clearly understood that the above examples are given for explanation only and that other voltage values may be used so as to provide similar programming, erasing, and reading operations.

For instance, a 4 Mb (megabit) flash memory core array is typically manufactured in the form of an N×M matrix on a single chip where N equals the number of rows and M equals the number of columns. The array is divided into a number of sectors, such as eight, each sector defining a selectable block. Each sector is formed of a predetermined number of rows which are grouped together. For the 4 Mb array divided into eight sectors, each block has a size of 512 K bits or 64 K bytes and may consist of 512 rows and 128 byte columns. Such a typical 4 Mb array 10 is shown in FIG. 1 which is composed of sector 0 through sector 7 corresponding to blocks 12, 14, 16, 18, 20, 22, 24 and 26. Each of the sectors or blocks 12–26 stores 512 K bits of data arranged in 512 rows and 128 byte columns.

In conventional operation, the data stored in each of the plurality of sectors or blocks 12–26 can be altered independently. In other words, data stored in certain ones of the sectors can be changed while the data stored in the other remaining sectors are kept unchanged. In order to alter the storage content in one of the plurality of sectors such as sector 0 (block 12), a sector-erase command is first executed. After the sector-erase command has been issued, this will cause the data pattern stored in the sector 0 to have all logic "1" pattern. Then, sector 0 is ready to have re-written into it whatever new data pattern is desired by the user.

In other cases, it will be needed that the storage content (data pattern) in all of the sectors, sector 0 through sector 7 (entire array or chip), be altered. As a result, instead of generating the sector-erase command, a chip-erase command will be executed. After the chip-erase command has been issued, this will cause the data pattern stored in all of the sectors, sector 0 through sector 7, to have all logic "1" pattern. Thereafter, all of the sectors (0–7) are ready to have re-written into them whatever new data patterns are desired by the user.

Unfortunately, the chip-erase command is merely a sequence of sector-erase commands consisting of a first erase-sector command for sector 0, a second erase-sector command for sector 1, . . . an eighth erase-sector command for sector 7. Thus, the total erase time in the chip-erase operation is the summation of the erase times for all of the eight sectors. In other words, the chip-erase time is approximately 8 times as long as the sector-erase time for one sector. Therefore, the chip-erase operation is still a time-consuming task utilizing this sequential approach.

Accordingly, it would be desirable to provide an improved erase method for performing an erasing operation with a reduced amount of total erase time, while maintaining the threshold voltage $V_T$ distribution after a multiple-sector or all-sector erasing operation to be as good as the $V_T$ distribution after a conventional single-sector erase operation.

SUMMARY OF THE INVENTION

Accordingly, it is a general object of the present invention to provide an improved erasing method used in an array of flash EEPROM memory cells arranged in a plurality of sectors for performing an erasing operation with a reduced amount of total erase time than has been traditionally available.

It is an object of the present invention to provide a unified erase method used in an array of flash EEPROM memory cells arranged in a plurality of sectors for performing a single-sector, multiple-sector, or all-sector erasing operation with a reduced amount of total erase time.

It is another object of the present invention to provide a unified erase method used in an array of flash EEPROM memory cells arranged in a plurality of sectors which applies an erase pulse to all sectors simultaneously in which the erase-on signals have not been turned off.

It is still another object of the present invention to provide an improved erasing method used in an array of flash EEPROM memory cells arranged in a plurality of sectors which stores the current address of each sector in a corresponding register at a point where an erase-verify operation fails and applies an erase pulse simultaneously and only to all sectors that have not passed the erase-verify operation.

In a preferred embodiment of the present invention, there is provided an unified erase method used in an array of flash EEPROM memory cells arranged in a plurality of sectors for performing either a single-sector, multiple-sector, or all-sector erasing operation with a reduced amount of total erase time. An erase-on signal is turned ON only in certain ones of the plurality of sectors which are required to be erased. All bytes in the certain ones of the plurality of sectors which are required to be erased are programmed to all "0" state initially. The current address in the certain ones of the plurality of sectors which are required to be erased are set to a first address. An erase-verify operation is performed sequentially on the plurality of sectors from a first sector to a last sector beginning with the first address thereof if its corresponding erase-on signal is not turned OFF.

The corresponding erase-on signal for each sector that has passed the erase-verify operation is turned OFF so that no erase pulse is applied to that sector thereafter. The current address of each sector is stored in a corresponding register at a point where the erase-verify operation failed. An erase pulse is applied then to all sectors simultaneously that have not passed the erase-verify operation. Each time after the erase pulse has been issued, the erase-verify operation is started again beginning at the current address stored. The erasing operation is terminated when the erase-on signals have been turned OFF in all sectors of the plurality of sectors.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 2 is a flow chart of the prior art method for sector-erase operation in the EEPROM memory device of FIG. 1.

DESCRIPTION OF THE PREFERRED EMBODIMENT

Figure 1:
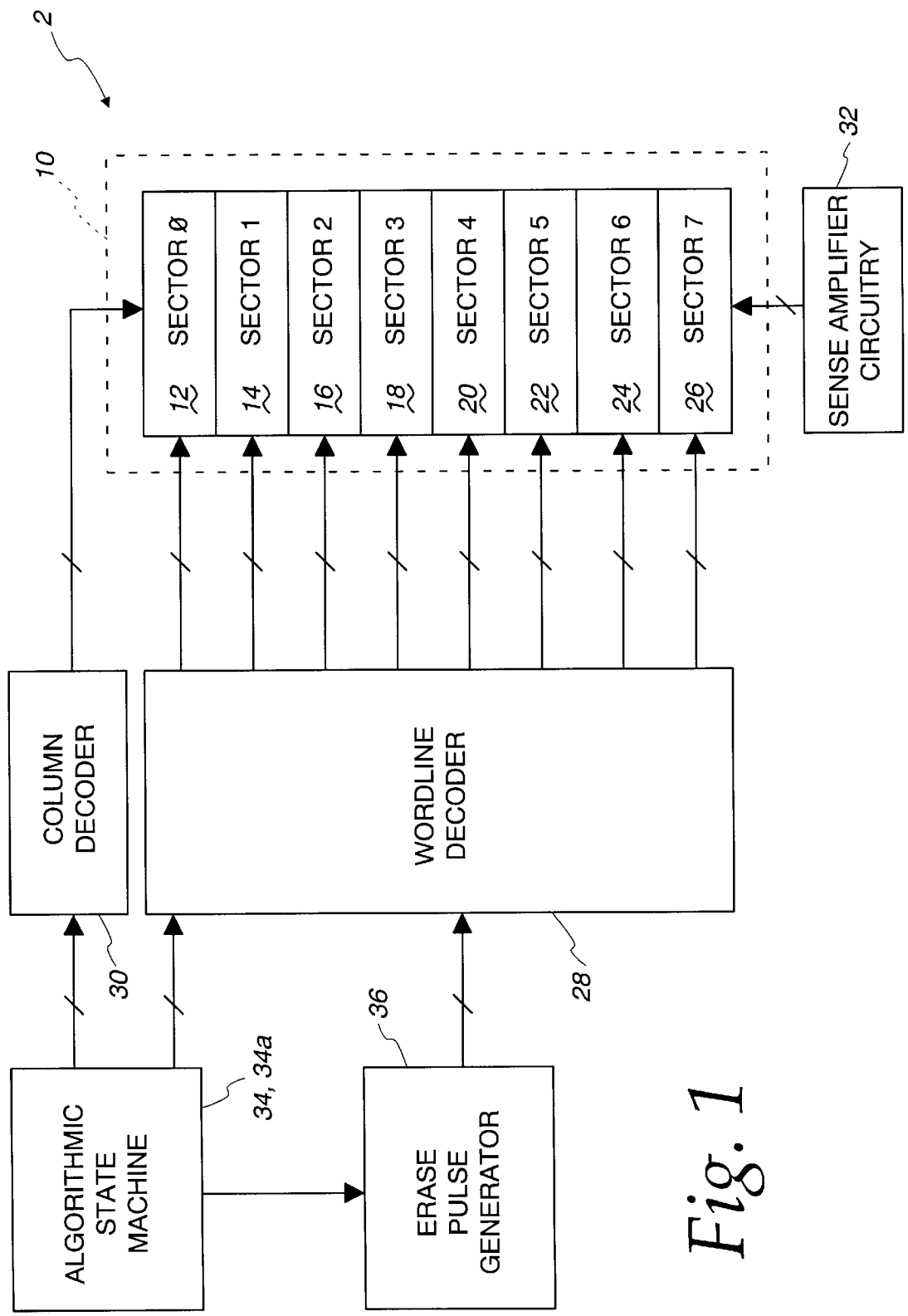
FIG. 1 is a simplified block diagram of a conventional EEPROM semiconductor integrated circuit memory device.

Before describing in detail the unified erase method for performing the erasing operation of the present invention, it is believed that it would be helpful in understanding the principles of the instant invention and to serve as a background by explaining initially the conventional method for performing a sector-erase operation in an EEPROM memory device of FIG. 1. It should be noted that well known circuits and/or control lines not particularly relevant to understanding of the operating principles of the conventional sector-erase method have been purposely omitted for the sake of clarity. Accordingly, the conventional method employed for performing the sector erase operation in the EEPROM memory device of FIG. 1 will now be described hereinbelow as well as the problems associated therewith in connection with FIG. 2.

In FIG. 1, there is shown an EEPROM semiconductor integrated circuit memory device 2 which includes a 4 Mb memory core cell array 10 formed of a plurality (eight) of sector 0 through sector 7 corresponding to selectable blocks 12, 14, 16, 18, 20, 22, 24 and 26, respectively. Each sector is formed of 512 rows which are grouped together. Each of the sectors 12–26 store 512 K bits of data which is arranged in 512 rows and 128 byte columns. The memory device 10 further includes a wordline decoder 28 and a column decoder 30 coupled to the sectors 12–26 of the array 10. Sense amplifier circuitry 32 is also coupled to the sectors 12–26 for sensing or reading the data from a particular address (i.e., a specific row and column) in the various sectors and for transmitting such data to external communications. An algorithmic state machine 34 is provided for controlling the overall operation of programming, erasing and reading of the memory cells in the various sectors by causing appropriate signals to be sent from the wordline decoder 28 and the column decoder 30. During the erasing operation, an erase pulse generator 36 is used to apply erase pulses to memory cells under the control of the state machine.

In FIG. 2, there is illustrated a flow chart 200 of a conventional method for performing the sector-erase operation. It should be understood that a sector-erase command will be given by the state machine 34 (FIG. 1) so as to make all bits in the sector to have a logic "1" pattern regardless of what the data pattern was stored in the sector prior to the sector-erase operation. Therefore, a block 210 is first provided in which all bytes in the sector selected to be erased (i.e., sector 0, 1, . . . or 7) are pre-programmed to a state or logic level "0". This is performed so that all the bytes in the whole sector will begin to erase uniformly from state "0" to state "1". However, before all the bytes in the sector are erased from the pre-programmed state "0", an erase-verify operation is performed by the state machine 34 to check if the bytes are already in the state "1". Thus, in block 212 the first address such as address 0 of the selected sector is chosen to be the current address.

Therefore, at decision block 214 a determination is made as to whether the current address (address 0) of the sector is in the state "1". If the current address is in the state "1", then it is next determined in decision block 216 whether the current address is the last address of the sector. If it is not the last address, then in block 218 the current address is incremented by 1 (i.e., address 0+1=address 1). Next, the block 214 will again check the current address (this time it is address 1) to determine if it is in the state "1". If the answer is "yes" again, the block 216 will again check if the current address (address 1) is the last address. If the answer is "no" again, the block 218 will increase again the current address by 1 to "address 2". This process is repeated over and over again until the last address is reached. If the last address of the sector has been checked so as to indicate that all bytes in the sector are in state "1", the answer will be "yes" from the decision block 216 and a block 220 will be encountered indicating that the whole sector has been erased.

If at any current address it is determined by the decision block 214 to be not in the state "1", then at block 222 an erase (tunneling) pulse from the pulse generator 36 will be issued to all the bytes in the sector as controlled by the state machine 34. Then, the erase-verify operation will continue in the block 214 at the address that failed to be erase verified prior to the issuance of the erase pulse.

Referring still to FIGS. 1 and 2, if all of the sectors, (i.e., sectors 0–7) in the whole array 10 are to be erased, then the state machine 34 will generate a chip-erase command in lieu of the sector-erase command. However, the chip-erase command is a sequence of sector-erase commands such as erase sector–0, erase sector–1, . . . and so on. As can be seen, in the prior art chip-erase operation, erasure of the second sector (i.e., sector 1) will not commence until the erase operation of the first sector (i.e., sector 0) has been completed. This is likewise true for all of the remaining sectors 2–7.

If it is assumed that the average number of erase (tunneling) pulses needed to erase a sector is 15, then for the eight sectors of FIG. 1, the total number of erase pulses for the entire chip (array) would be 8×15=120 pulses. If each pulse has a width of approximately 10 ms, then the total erase time will be a little over a second or 10 ms×120=1.2 seconds. Thus, the conventional chip-erase operation suffers from the disadvantage of requiring a relatively long chip-erase time utilizing this sequential approach.

In view of this, the inventor has developed a new and improved unified erase method for performing an erase operation with a reduced amount of total erase time. In order to decrease the chip-erase time, this is accomplished by applying the erase pulse to all the sectors at the same time. In other words, when the erase pulse is generated, it is sent simultaneously to all of the bytes in all of the sectors that are to be erased. Again, assuming that it takes 20 erase pulses for the worst sector to be erased, then it will take 10 ms×20 or 0.2 seconds. Thus, one second will have been saved over the prior art method. In addition to the saving of time over the prior art method, the present invention maintains the threshold voltage $V_T$ uniformity after erase to be as good as the conventional method by applying an erase pulse simultaneously and only to those sectors which have not passed completely an erase-verify operation.

Figure 3B:
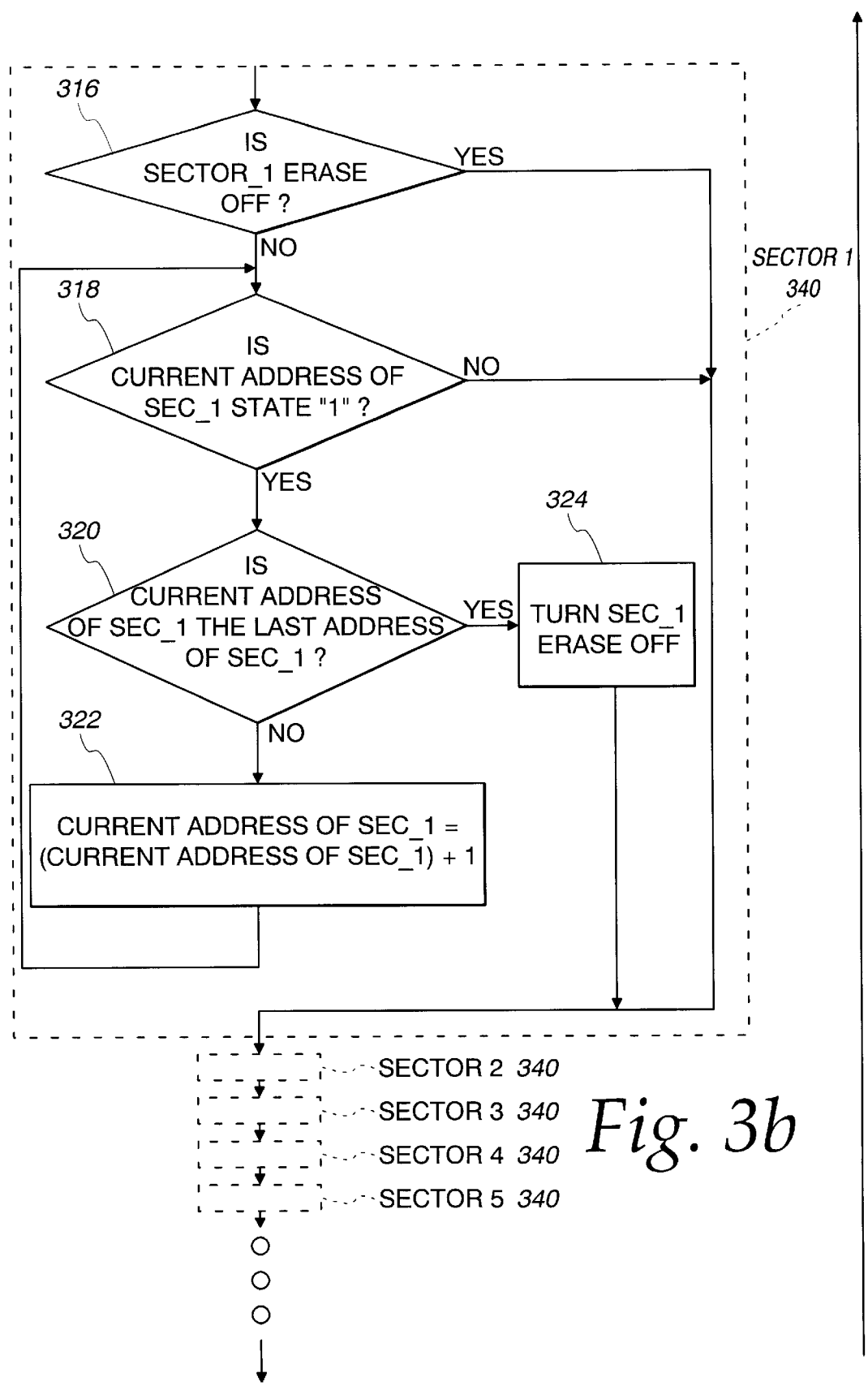
FIG. 3 is a flow chart of a unified erase method for either single-sector, multiple-sector, or all-sector erasing operation, according to the teachings of the present invention.

In FIG. 3, there is shown a flow chart 300 of a unified method for performing either a single-sector, multiple-sector, or all sector (whole chip) erase operation in accordance with the principles of the present invention. It should be understood that the unified method of the present invention operates in conjunction with the data stored in the sectors –7 of the array within the memory device 10 of FIG. 1. First, a block 310 is encountered in which an erase-on signal is switched or turned ON only for each sector that needs to be erased. In the illustration of eight sectors –7 of FIG. 1, if only sector 7 is required to be erased then only the erase-on signal for sector 7 will be turned on. The erase-on signals for the corresponding sectors –6 will be turned OFF so that these sectors will be bypassed, as will be explained hereinbelow. The erase-on signal being switched ON serves the purpose of selectively applying an erase pulse to the sectors. The erase-on signal is switched ON only for the sectors that need to be erased and that have not passed completely an erase-verify operation.

For ease of illustration, there will be explained the simplified case of only two sectors: namely sector 0 and sector 1. It will be assumed that it is desired to erase both of these sectors. Thus, in the block 310 the erase-on signals for the sector 0 and the sector 1 will both be turned ON. Next, a block 312 is provided in which all bytes in the sectors having their erase-on signals turned ON are pre-programmed to a logic state or level "0".

Before an erase pulse is applied to all bytes in the multiple sectors that are to be erased, an erase-verify operation is performed by a state machine 34a in the same conventional way as in FIG. 2 to check if the bytes are already in the state "1". This is performed sequentially on a sector-by-sector basis. In the present example, the starting address would be address 0 of sector 0 and the ending address would be the last address of sector 1. Therefore, in the block 314 the first address such as address 0 of each sector with its erase-on signal turned ON will be set to be the current address for those sectors.

Next, at decision block 316 a determination is made as to whether the erase-on signal for the first sector (sector 0) is turned OFF. If the answer is "yes", then the particular sector will be bypassed. Each of the sectors will be checked for this condition one by one. Since it was assumed that the erase-on signal for sector 0 was turned ON, then a block 318 is reached where a determination is made as to whether the current address, e.g., address 0, for sector 0 is in the state "1". If the current address is in the state "1", then it is next determined in decision block 320 whether the current address for sector 0 is the last address of the sector. If it is not the last address, then in block 322 the current address of sector 0 is incremented by 1 (i.e., address 0+1=address 1).

Next, the block 318 will again check the current address for the sector 0 (this time it is address 1) to determine if it is in the state "1". If the answer is "yes" again, the block 320 will again check if the current address or "address 1" for the sector 0 is the last address. If the answer is "no" again, the block 322 will increase again the current address by 1 to "address 2". This procedure is repeated over and over until the last address for sector 0 is reached. If the last address for sector 0 has been checked so as to indicate that all bytes in the sector are in the state "1", the answer will be "yes" from the decision block 320 and a block 324 will be encountered so as to turn OFF the erase-on signal for sector 0. This indicates that sector 0 has passed the erase-verify operation and that the sector 0 has been erased. By turning OFF the erase-on signal, the sector 0 will no longer receive the erase pulse when they are generated thereafter. This serves to prevent an over-erase problem.

On the other hand, if at any current address for sector 0 it is determined by the decision block 318 to be not in the state "1", then unlike the prior art no erase pulse is applied yet and only the location of this current address is stored in an address register by the block 318 so as to remember where in the sector 0 that the erase verify operation failed. The next sector will be likewise checked to determine if the erase-on signal for that sector (sector 1) is turned OFF.

Since sector 1 in this case is also the last sector, a decision block 326 is encountered where a determination is made as to whether the erase-on signal for the last sector (sector 1) is turned OFF. Since it was assumed that the erase-on signal for sector 1 was turned ON, then a block 328 is reached where a determination is made as to whether the current address, i.e., address 0, for sector 1 is in the state "1". If the current address is in the state "1", then it is next determined in decision block 330 whether the current address for sector 1 is the last address of the sector. If it is not the last address, then in block 332 the current address of sector 1 is incremented by 1 (i.e., address 0+1=address 1).

Next, the block 328 will again check the current address for the sector 1 (this time it is address 1) to determine if it is of the state "1". If the answer is "yes" again, the block 330 will again check if the current address (address 1) for the sector 1 is the last address. If the answer is "no" again, the block 332 will increase again the current address by 1 to "address 2". This procedure is repeated over and over again until the last address for sector 1 is reached. If the last address for sector 1 has been checked so as to indicate that all bytes in the sector 1 are in the state "1", the answer will be "yes" from the decision block 330 and a block 334 will be encountered so as to turn OFF the erase-signal for sector 1. This indicates that sector 1 has passed the erase-verify operation and that the sector 1 has been erased. By turning OFF the sector-on signal, the sector 1 will no longer receive the erase pulses when they are generated thereafter.

If at any current address it is determined by the decision block 328 to be not in the state "1", then at block 340 an erase (tunneling) pulse from the pulse generator 36 will be issued to all the bytes in all the sectors having their erase-on signal not turned OFF as controlled by the state machine 34a. Then, the erase-verify operation will continue in the block 316 and then block 318 for the first sector having its erase-on signal turned ON beginning at the address that failed to erase verify prior to the issuance of the erase pulse.

In a decision block 336, a determination is made as to whether all of the erase-on signals for the sectors to be erased have been turned OFF. If the answer is "yes" from the block 336, a block 338 will be encountered indicating that all of the selected sectors that needed to be erased have been erased. Thus, the erase operation has been completed, and no more erase pulses will be generated.

On the other hand, if the answer is "no" from the block 336, then an erase (tunneling) pulse from the pulse generator 36 will be issued to all the bytes in all the sectors in which the erase-on signal has not been turned OFF. It should be noted that a separate address register is required for each sector so as to store the address where the erase-verify operation failed. In this manner, then this stored location can be returned to after the application of each erase pulse so as to continue the erase-verify operation at the point where it did not pass. This entire process is repeated at the block 316 for the first sector having its erase-on signal turned ON until the block 336 indicates that all of the erase-on signals have been turned OFF.

In the general case of an array having N sectors, all of the blocks 316–324 within the dotted line 340 referred to as "erase-verify for sector 0" in the flow chart of FIG. 3 must be inserted for each additional sector i between the portions of the flow chart pertaining to the sector 0 and the sector 1. In other words, the added sections i (where i is between 0 and N−1) each require the same blocks as the portion pertaining to sector 0. The last sector N−1 would still include the locks 326–338 similar to the sector 1 of FIG. 3. In case of the 8 sectors of FIG. 1, sector 0 through sector 7, the dotted block 340 would be repeated six times for the sector 1 through sector 6. Following the sector 6, there would be used the blocks 326–338 for the last sector or sector 7.

It should be understood that the size or the number of bits required for each of the address registers may be varied dependent upon the trade-off between a reduced amount of chip area and a high resolution for the erase-verify operation. For example, if a 64 K bytes sector has 512 rows and 128 byte columns, then the size of the address register must be 16 bits wide ($2^9 \times 2^7$) in order to store the address on a byte basis. In order to reduce the amount of chip area, the size of the register could be made to be 9 bits wide so as to store the address on a row basis ($2^9$). In order to further reduce the size of the register, the address of only every 16th row could be stored. Thus, the register needs to be only 5 bits wide.

From the foregoing detailed description, it can thus be seen that the present invention provides a unified erase method used in an array of flash EEPROM memory cells arranged in a plurality of sectors for performing either a single-sector, multiple-sector, or all-sector erasing operation with a reduced amount of total erase time and a uniform $V_T$ distribution as good as that of a single-sector erase operation. This is accomplished by applying an erase pulse to all sectors simultaneously in which the erase-on signals have not been turned OFF. In this manner, the number of erase pulses required to erase the whole chip (all sectors) or multiple sectors is the same as the number of pulses needed to erase a single sector.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A unified erase method used in an array of flash EEPROM memory cells arranged in a plurality of sectors for performing either a single-sector, multiple-sector, or all-sector erasing operation with a reduced amount of total erase time, said erase method comprising the steps of:

turning an erase-signal ON in only certain ones of said plurality of sectors which are required to be erased;

programming initially all bytes in said certain ones of said plurality of sectors which are required to be erased;

setting current address in said certain ones of said plurality of sectors which are required to be erased to a first address;

(a) determining whether a first sector of said plurality of sectors has its erase-on signal turned OFF;

(b) bypassing said first sector if said erase-on signal is turned OFF and proceeding to a second sector of said plurality of sectors;

(c) determining whether the current address has been erased if said erase-on signal is not turned OFF;

(d) proceeding to the second sector of said plurality of sectors if the current address has not been erased and storing in an address register the current address;

(e) determining whether the current address is the last address of said first sector if the current address has been erased;

(f) increasing the current address by one if the current address is not the last address and repeating steps (c)–(e);

(g) turning OFF said erase-on signal if the current address is the last address and proceeding to the second sector of said plurality of sectors;

repeating steps (a) through (g) for the remaining sectors of said plurality of sectors except for a last sector;

determining whether the last sector of said plurality of sectors has its erase-on signal turned OFF;

determining whether the erase-on signal for all sectors of said plurality of sectors are turned OFF if the last sector has its erase-on signal turned OFF;

(i) determining whether the current address of the last sector has been turned OFF if said erase-on signal is not turned OFF;

(j) storing current address in an address register if the current address is not erased;

(k) determining whether the current address is a last address of said last sector if the current address has been erased;

increasing the current address by one if the current address is not the last address and repeating steps (i) through (k);

turning OFF said erase-on signal if the current address is the last address;

applying an erase pulse to all bytes in all sectors simultaneously in which the erase-on signals have not been turned OFF if the current address of the last sector has not been erased or if the erase-on signal for all sectors have not been turned OFF and repeating steps (a) through (k); and terminating the erasing operation when the erase-on signal has been turned OFF in all sectors of said plurality of sectors.

2. A unified erase method as claimed in claim 1, wherein the step of programming initially all bytes includes the step of setting all bytes to a state "1".

3. A unified erase method as claimed in claim 2, wherein the step of determining whether the current address has been erased includes the step of checking if the current address is set to a state "1".

4. A unified erase method as claimed in claim 3, wherein the step of applying the erase pulse includes the step of beginning an erase-verify operation at the current address stored for each sector.

5. A unified erase method as claimed in claim 4, wherein each of said sectors is arranged in rows and columns and wherein said corresponding register stores the row and column of the current address that has not been erased.

6. A unified erase method as claimed in claim 4, wherein each of said sectors is arranged in rows and columns and wherein said corresponding register stores only the row of the current address that has not been erased.

7. A unified erase method as claimed in claim 4, wherein each sector is arranged in rows and columns and said corresponding register stores every predetermined number of rows of the current address that has not been erased.

8. A unified erase method used in an array of flash EEPROM memory cells arranged in a plurality of sectors for performing either a single-sector, multiple-sector, or all-sector erasing operation with a reduced amount of total erase time, said erase method comprising the steps of:

selectively turning ON an erase-on signal in only certain ones of said plurality of sectors which are required to be erased;

programming initially all bytes in said certain ones of said plurality of sectors which are required to be erased;

setting current address in said certain ones of said plurality of sectors which are required to be erased to a first address;

determining whether each sector of said plurality of sectors has its corresponding erase-on signal turned OFF;

sequentially performing an erase-verify operation on said plurality of sectors from a first sector to a last sector beginning with the first address of said sector if its said corresponding erase-on signal is not turned OFF;

turning OFF said corresponding erase-on signal for each sector that has passed the erase-verify operation;

storing current address of each sector at a point where the erase-verify operation failed;

applying an erase pulse simultaneously to all sector that has not passed the erase-verify operation and repeating the erase-verify operation beginning at the current address stored; and terminating the erasing operation when the erase-on signal has been turned OFF in all sectors of said plurality of sectors.

9. A unified erase method as claimed in claim 8, wherein said erase-verify operation includes the step of checking whether each address in the sector has been erased.

10. A unified erase method as claimed in claim 8, wherein each of said sectors is arranged in rows and columns and wherein said corresponding register stores the row and column of the current address that has not been erased.

11. A unified erase method as claimed in claim 8, wherein each of said sectors is arranged in rows and columns and wherein said corresponding register stores only the row of the current address that has not been erased.

12. A unified erase method as claimed in claim 8, wherein each sector is arranged in rows and columns and said corresponding register stores every predetermined number of rows of the current address that has not been erased.

* * * * *